United States Patent
Abys et al.

(10) Patent No.: US 6,335,107 B1
(45) Date of Patent: Jan. 1, 2002

(54) METAL ARTICLE COATED WITH MULTILAYER SURFACE FINISH FOR POROSITY REDUCTION

(75) Inventors: Joseph Anthony Abys, Warren; Chonglun Fan, Bridgewater, both of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/404,059

(22) Filed: Sep. 23, 1999

(51) Int. Cl.⁷ .................................... B32B 15/01
(52) U.S. Cl. ................. 428/680; 257/666; 257/677; 428/670; 428/672; 428/675; 428/678; 428/679; 428/681; 428/901; 428/926; 428/929; 439/55
(58) Field of Search .................. 428/670, 672, 428/675, 678, 679, 680, 681, 926, 929, 901; 439/55; 257/666, 677

(56) References Cited

U.S. PATENT DOCUMENTS

| | | | |
|---|---|---|---|
| 3,617,320 A | 11/1971 | Lee | 106/18.1 |
| 4,808,967 A | 2/1989 | Rice et al. | 428/667 |
| 5,180,482 A | 1/1993 | Abys et al. | 205/224 |
| 5,675,177 A | 10/1997 | Abys et al. | 257/736 |
| 6,139,977 A | * 10/2000 | Abys et al. | 428/680 |

OTHER PUBLICATIONS

Granitz, Donald A., "Palladium Alloy as a Plating Alternative for Hybrid Microelectronic Packages", *Electronic Packaging and Production*, Feb. 1982, pp. 117–119.

* cited by examiner

*Primary Examiner*—Robert R. Koehler
(74) *Attorney, Agent, or Firm*—Lowenstein Sandler PC

(57) ABSTRACT

In accordance with the invention, a metal substrate is coated with a multilayer surface finish comprising, in succession, an amorphous metal underlayer, a corrosion-resistent metal middle layer and one or more outer layers of precious metal. In an exemplary embodiment the metal substrate comprises copper alloy, the amorphous metal underlayer is Ni—P, the middle layer is nickel and the outer layer is palladium. The resulting structure is particularly useful as an electrical connector.

8 Claims, 3 Drawing Sheets

METAL ARTICLE COATED WITH MULTILAYER SURFACE FINISH FOR POROSITY REDUCTION

FIELD OF THE INVENTION

This invention relates to plated metal articles for protecting a metal substrate from corrosion and, in particular, to an article having a multilayer finish comprising an amorphous metal underlayer, a corrosion-resistant metal middle layer and one or more precious metal outer layers. The surface finish is especially useful for electrical and electronic devices such as connectors and integrated circuit lead frames.

BACKGROUND OF THE INVENTION

Corrosion resistance is particularly important in electrical and electronic devices including electrical connectors. High quality connectors are increasingly important in a wide variety of products including consumer electronics, household appliances, computers, automobiles, telecommunications, robotics and military equipment. Connectors provide the paths whereby electrical current flows from one device to another. Quality connectors should be highly conductive, corrosion resistant, wear resistant, readily connected by solder and preferably inexpensive.

Unfortunately no single material has all of the desired characteristics. Copper and many of its alloys are highly conductive, but they are subject to corrosion in typical ambients, producing reactive oxides and sulfides. The corrosion products on the surface reduce the conductivity of the connectors and the reliability of interconnection. The reactive corrosion products also interfere with the formation and reliability of solder bonds and can migrate to other electronic components which they adversely affect.

Thin precious metal layers have been applied to copper surfaces to increase corrosion resistance. But the precious metal layers are porous, and corrosion through the pores continues to be a problem.

Nickel coatings have been applied under the precious metal outer layer to serve as barriers to the formation and migration of reactive copper products. However nickel coatings also exhibit porosity. Although the porosity and corrosion are reduced by the nickel barrier, the corrosion products of copper can still form and migrate through the finish. The porosity of the nickel coatings can be reduced by increasing the nickel thickness, but thick nickel coatings take substantially longer to produce and tend to crack in use. Longer production times mean lower productivity and higher production cost.

An improved integrated circuit lead frame comprising copper coated with nickel followed by a composite of noble metal layers is described in U.S. Pat. No. 5,675,177 issued to applicant J. A. Abys et al. on Oct. 7, 1997, which is incorporated herein by reference. These coated lead frames have high corrosion resistance and good electrical and mechanical properties. However even these surface finishes cannot prevent the substrate metal from corrosion in a corrosive environment. Accordingly, there is a need for a surface finish with improved porosity reduction.

SUMMARY OF THE INVENTION

In accordance with the invention, a metal substrate is coated with a multilayer surface finish comprising, in succession, an amorphous metal underlayer, a corrosion-resistant metal middle layer and one or more outer layers of precious metal. In an exemplary embodiment the metal substrate comprises copper alloy, the amorphous metal underlayer is Ni-P, the middle layer is nickel and the outer layer is palladium. The resulting structure is particularly useful as an electrical connector.

BRIEF SUMMARY OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and are not to scale.

DETAILED DESCRIPTION

Figure 1:
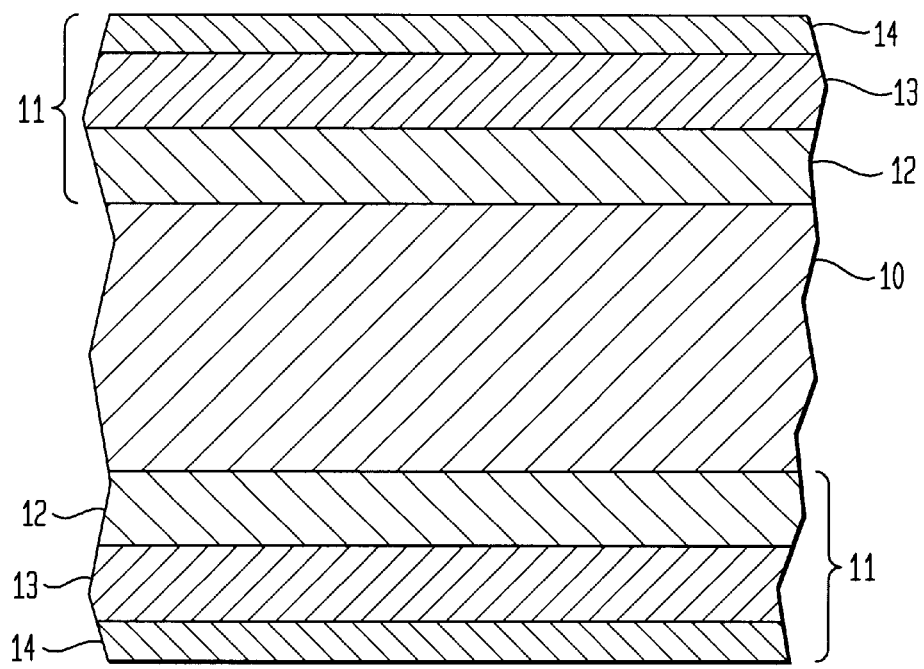
FIG. 1 is a schematic cross section of a metal article coated in accordance with the invention.

FIG. 1 is a schematic cross section of a metal substrate 10 coated with a composite layer 11 including, in ascending order from the substrate, an underlayer 12 of amorphous metal, an intermediate layer 13 of corrosion resistant metal and an outer layer 14 of precious metal. The metal substrate is typically a metal subject to corrosion in typical ambients such as copper, copper alloy, iron and iron alloys. The underlayer is an amorphous metal coatable on the substrate. It typically has very low porosity. Nickel-phosphorus alloy with phosphorus $\geq$ about 10 wt % is satisfactory for substrates comprising copper or iron. Nickel-phosphorus-tungsten or cobalt-phosphorus can also be used. The intermediate layer 13 of corrosion resistant metal can be nickel, nickel alloys, cobalt or cobalt alloys. The precious metal layer (or layers) 14 can be palladium, gold, rhodium, ruthenium, platinum or their alloys, especially palladium-nickel and palladium-cobalt.

The amorphous underlayer 12 should have a thickness in the range about 0.1–2.5$\mu$m. The intermediate layer 13 typically has a thickness about 0.1–2.5 $\mu$m; and the precious metal layer is preferably less than about 1.5 $\mu$m.

The amorphous metal has no substantial crystalline structure and no significant number of grain boundaries in the material. This eliminates structural defects in grain boundaries that are a source of porosity in a coating having a crystalline structure. Therefore, the amorphous metal coating can have very low porosity. In addition, the corrosion resistant metal coating immediately underneath the precious metal layer(s) minimizes the formation of corrosion products on the finished surface.

In surface finishing processes, the production of the coating underneath the precious metal layer(s) is usually the speed-controlling step. By using an underlayer coating with low intrinsic porosity, one may significantly reduce its thickness without compromising the quality of the surface finish. This results in a dramatic increase in production speed and production yields and a considerable reduction in production cost.

The invention can be understood more clearly by consideration of the following specific examples describing the fabrication of coated metal articles in accordance with the invention.

EXAMPLE 1

Electrical Connector

Figure 2:
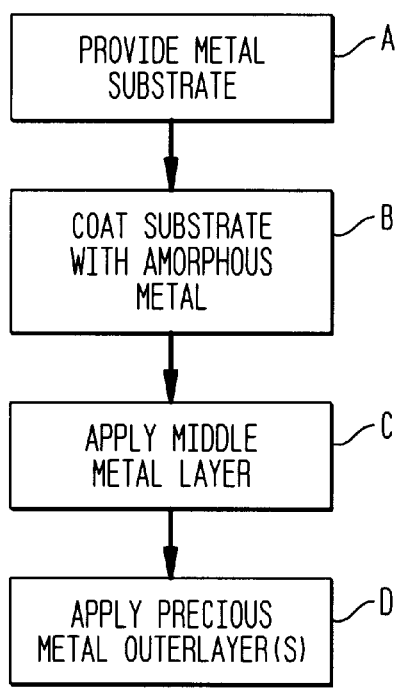
FIG. 2 is a block diagram showing the steps involved in making a coated metal article.

FIG. 2 is a block diagram of the steps in making a coated metal electrical connector. The first step, shown in Block A, is to provide a metal substrate. It can be formed into a desired configuration as by stamping or etching a metal blank.

Figure 3:
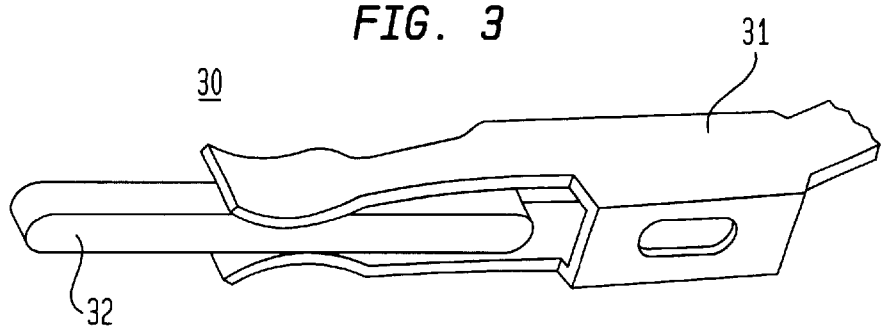
FIG. 3 shows a substrate for making an electrical connector using the process of FIG. 2.

FIG. 3 illustrates electrical connector 30 having a connector body 31 and a mating pin 32. The connector body 31 and the pin 32 are made of high conductivity metal such as copper-nickel-tin alloy No. 725 (88.2 wt % Cu, 9.5 Ni, 2.3 Sn; ASTM Spec. No. B 122), and the pin and body serve as exemplary substrates for this process.

The next step, shown in Block B, is to coat the conductive substrate with an amorphous coating such as a nickel-phosphorus coating. The amorphous layer should have a thickness greater than about 0.1 µm and is preferably about 0.5 to 1.0 µm. It can be electrodeposited Ni-P with P content higher than about 10 wt % to assure amorphous structure. A suitable Ni-P amorphous layer can be electrodeposited using the following bath composition:

| Nickel sulfate | $NiSO_4 6H_2O$ | 100–300 g/l |
| Nickel chloride | $NiCl_2 6H_2O$ | 40–60 g/l |
| Phosphorous acid | $H_3PO_3$ | 40–100 g/l |
| Phosphoric acid | $H_3PO_4$ | 0–50 g/l |

The third step, Block C, is to apply over the amorphous coating a middle layer of corrosion resistant metal such as nickel. The metal middle layer should have a thickness greater than about 0.1 µm and is preferably about 0.5–1.0 µm. A suitable Ni layer can be electrodeposited using the following bath:

| Nickel sulfamate | $Ni(SO_3NH_2)_2 4H_2O$ | 315–650 g/l |
| Nickel chloride | $NiCl_2 6H_2O$ | 0–22 g/l |
| Boric acid | $H_3BO_3$ | 30–45 g/l |

A wetting agent to avoid pits in deposit and a hardening agent to increase hardness of deposit may be added to the bath based on requirements. Alternatively, the metal middle coating can be a nickel alloy, cobalt or a cobalt alloy.

The next step, shown in Block D, is to apply one or more layers of precious metal (palladium, gold, rhodium, ruthenium, platinum or their alloys such as palladium-nickel or palladium-cobalt) on top of the middle layer. The precious metal total thickness is less than about 1.5 µm. For a connector it is advantageously greater than about 0.1 µm and preferably about 0.5–1.0 µm. A suitable palladium layer can be deposited from the palladium electroplating solution described in U.S. Pat. No. 4,911,799 issued on Mar. 27, 1990 to J. A. Abys et al., which is incorporated herein by reference. A palladium-nickel alloy with nickel content preferably 10–30 wt % can be deposited from the electroplating solution described in U.S. Pat. No. 4,911,798 issued on Mar. 27, 1990 to J. A. Abys et al., which is incorporated herein by reference. A palladium-cobalt alloy can be deposited as described in the copending U.S. patent application Ser. No. 08/974,120, now U.S. Pat. No. 5,976,344, filed by J. A. Abys et al. on Nov. 19, 1997which is incorporated herein by reference. Exemplary compositions and electroplating conditions for depositing gold layers are described in F. H. Reed et al., *Gold Plating Technology*, pp. 26 and 46 (Electrochemical Publications Ltd., Scotland, 1987). Plating of rhodium, ruthenium and platinum are described in *Metal Finishing*, (Guidebook and Directory Issue), Vol. 97, No. 1 (January, 1999).

Figure 4A:
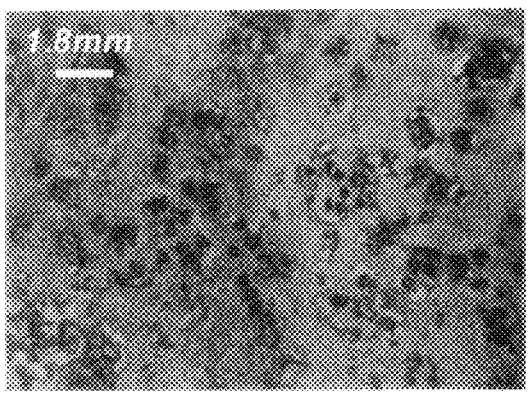
FIGS. 4A and 4B are photographs comparing the corrosion resistance of the invention with a conventionally coated article.
Figure 4B:
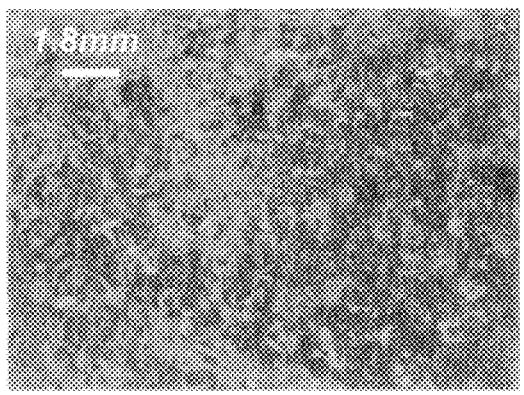

FIGS. 4A and 4B show finished Cu substrates sequentially subjected to $H_2SO_3$ (24hrs), to $(NH_4)_2S$ (15 mins) and to heat at 75° C. (15 min). Black spots indicate corrosion caused by porosity in the finish. Photograph FIG. 4A shows the conventional finish. Photograph 4B shows the finish described herein. As can be seen, the inventive finish exhibits less corrosion.

EXAMPLE 2

Integrated Circuit Lead Frame

An integrated circuit lead frame can also be fabricated by the process illustrated in FIG. 2. The only differences are that the substrate is different and the precious metal thickness can be less ($\geq 0.025$ µm).

Figure 5:
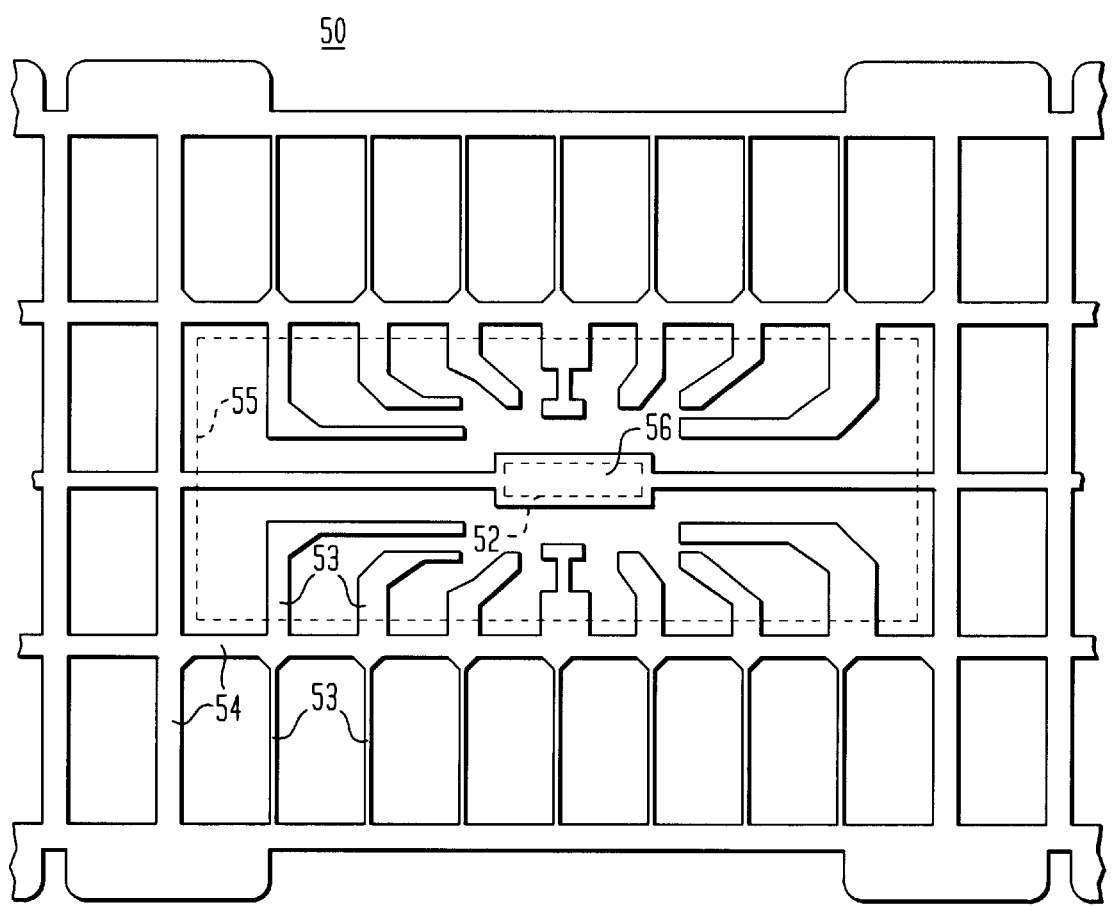
FIG. 5 shows a substrate for making an integrated circuit lead frame.

FIG. 5 illustrates a substrate 50 formed into configuration for use as a lead frame for an integrated circuit (IC). The substrate 50 includes a paddle 52 on which the IC is to be mounted and the leads 53 on which the IC is to be bonded. Dam bars 54 interconnect the leads before packaging. After the integrated circuit is bonded and a packaging medium has been applied over an area shown in phantom lines 55, the dam bars 54 are trimmed away.

The substrate of the lead frame can be copper or a copper alloy such as alloy No. 151 (99.9 wt. % Cu, 0.1% Zr) or alloy No. 194 (97.5 wt. % Cu, 2.35% Fe, 0.03% P, 0.12% Zn). Other conductive metals and alloys such as alloy No. 42 (42 wt. % Ni, 58% Fe) can also be used.

After the substrate is coated, an integrated circuit 56 is mounted and bonded to the coated substrate as described in U.S. Pat. No. 5,675,177 issued Oct. 7, 1997 to J. A. Abys et al.

The advantage of this surface finish is that it is much less porous than the conventional nickel/precious metal finish and is an efficient barrier to reduce exposure of the substrate metal.

It is to be understood that the above-described embodiments are illustrative of only a few of the many possible specific embodiments which can represent applications of the principles of the invention. Numerous and varied other arrangements can be readily devised by those skilled in the art without departing from the spirit and scope of the invention.

What is claimed is:

1. A coated metal article comprising:

a metal substrate;

disposed on the substrate a multilayer surface finish comprising, in succession, an amorphous metal underlayer having a very low porosity, a metal middle layer and at least one outer layer comprising precious metal.

2. The article of claim 1 wherein the amorphous metal is selected from the group consisting of nickel-phosphorus, nickel-phosphorus-tungsten and cobalt-phosphorus.

3. The article of claim 1 wherein the middle metal layer comprises a metal selected from the group consisting of nickel, nickel alloy, cobalt and cobalt alloy.

4. The article of claim 1 wherein the precious metal comprises a metal selected from the group consisting of palladium, gold, rhodium, ruthenium and platinum.

5. The article of claim 1 wherein the metal substrate comprises copper, iron or nickel.

6. The article of claim 1 wherein the amorphous metal has a thickness in the range 0.1–2.5 $\mu$m, the metal middle layer has a thickness in the range 0.1–2.5 $\mu$m and the precious metal has a thickness less than 1.5 $\mu$m.

7. An electrical connector comprising a coated article in accordance with claim 1.

8. A lead frame for an integrated circuit comprising a coated article in accordance with claim 1.

* * * * *